(12) United States Patent
Barber et al.

(10) Patent No.: US 8,145,166 B2
(45) Date of Patent: Mar. 27, 2012

(54) ENHANCED PROGRAMMABLE AUTOMATIC LEVEL CONTROL

(75) Inventors: Richard Glenn Barber, Morgan Hill, CA (US); Russell A. Brown, San Jose, CA (US)

(73) Assignee: Anritsu Company, Morgan Hill, CA (US)

( * ) Notice: Subject to any disclaimer, the term of this patent is extended or adjusted under 35 U.S.C. 154(b) by 471 days.

(21) Appl. No.: 12/339,668

(22) Filed: Dec. 19, 2008

(65) Prior Publication Data

US 2009/0191834 A1 Jul. 30, 2009

Related U.S. Application Data

(60) Provisional application No. 61/015,624, filed on Dec. 20, 2007.

(51) Int. Cl.
*H04B 1/06* (2006.01)

(52) U.S. Cl. ........... 455/232.1; 455/234.2; 455/245.2; 455/246.1; 455/247.1; 455/250.1; 330/254; 330/278; 330/149; 330/151

(58) Field of Classification Search ........... 455/234.1, 455/126, 127.1, 115.1, 127.4, 114.3; 330/133, 330/149, 151
See application file for complete search history.

(56) References Cited

U.S. PATENT DOCUMENTS

| | | | | |
|---|---|---|---|---|
| 5,920,808 A | * | 7/1999 | Jones et al. | 455/127.1 |
| 6,259,682 B1 | * | 7/2001 | Brown et al. | 370/311 |
| 6,337,599 B2 | * | 1/2002 | Lee | 330/149 |
| 6,434,374 B1 | * | 8/2002 | Muterspaugh | 455/234.1 |
| 6,670,849 B1 | * | 12/2003 | Damgaard et al. | 330/129 |
| 6,745,016 B2 | * | 6/2004 | Iwata et al. | 455/234.1 |
| 7,164,313 B2 | * | 1/2007 | Capofreddi et al. | 330/86 |
| 7,277,678 B2 | * | 10/2007 | Rozenblit et al. | 455/91 |
| 7,414,676 B2 | * | 8/2008 | Lindstrom et al. | 348/731 |
| 7,433,668 B2 | * | 10/2008 | Fischer et al. | 455/339 |
| 7,689,195 B2 | * | 3/2010 | Wu et al. | 455/336 |
| 7,873,334 B2 | * | 1/2011 | Itkin et al. | 455/126 |
| 7,917,105 B2 | * | 3/2011 | Drogi et al. | 455/126 |
| 7,933,570 B2 | * | 4/2011 | Vinayak et al. | 455/127.1 |
| 2005/0191975 A1 | * | 9/2005 | Talwalkar et al. | 455/115.1 |
| 2009/0052575 A1 | * | 2/2009 | Waheed et al. | 375/297 |
| 2010/0009646 A1 | * | 1/2010 | Mevel et al. | 455/234.1 |
| 2010/0048146 A1 | * | 2/2010 | McCallister | 455/78 |

* cited by examiner

*Primary Examiner* — Linh Nguyen
(74) *Attorney, Agent, or Firm* — Fliesler Meyer LLP

(57) ABSTRACT

An enhanced programmable automatic level control loop comprising an input for receiving an input RF signal; a level modulator, wherein the level modulator receives the input RF signal and a control signal and wherein the level modulator produces a first signal; a mixer that receives the first signal and mixes it with an LO signal to produce a second signal; a programmable attenuator that receives the second signal and produces an output signal; a level detector that monitors RF power of the output signal and produces a DC voltage proportional to the RF power; and wherein the DC voltage is received at a loop amplifier which produces the control signal.

18 Claims, 2 Drawing Sheets

US 8,145,166 B2

ENHANCED PROGRAMMABLE AUTOMATIC LEVEL CONTROL

CLAIM OF PRIORITY

This application claims benefit to the following U.S. Provisional Patent Application:

U.S. patent application No. 61/015,624 entitled ENHANCED PROGRAMMABLE AUTOMATIC LEVEL CONTROL, by Richard Glenn Barber and Russell A. Brown, filed Dec. 20, 2007;

BACKGROUND

1. Technical Field

The present invention relates to programmable automatic level control circuits.

2. Related Art

Spectrum analyzers are used to measure electrical signals according to their frequencies. A spectrum analyzer can also be used in combination with a tracking generator to perform network measurements. The tracking generator is a signal generator that follows the tuning of the spectrum analyzer (i.e., as the spectrum analyzer measures across a given frequency range the tracking generator will generate a signal that sweeps across the same frequency range). The frequency response of a given device (for example, an amplifier) can be measured by connecting the output of the tracking generator to the input of the device and measuring the frequency response with the spectrum analyzer. This is useful for measuring the frequency response of various devices, however it is only reliable so long as the output of the tracking generator is stable across a wide range of frequencies and operating temperatures.

SUMMARY

The present invention relates to programmable automatic level control (PALC). An automatic level control (ALC) circuit with programmable components, offers greater stability and faster response times as well as more accurate output. These programmable components enable a system to provide constant power level versus frequency and temperature at each selected power level. These components include a temperature stabilized detector; a programmable filter to avoid ALC related distortion of the leveled signal; a programmable gain selectable DC amp to optimize ALC loop gain for best loop speed and stability; a programmable DAC (digital to analog converter) for vernier power control; and a programmable ALC RF attenuator to provide RF gain equalization and to minimize spurious signal levels.

The ALC loop works for continuous wave (CW) or modulated signals. The loop is fast and robust enough to work while the frequency is sweeping across frequency bands. Additionally, the loop operates automatically to control level and provides programmability. The programmability allows the system software to optimize operation of the loop functions over frequency, and over temperature, for each chosen power level. It also allows system software to provide vernier power adjustments by adjusting a reference voltage using the DAC (Digital to Analog Converter). The system software can also access virtual tables stored in memory during calibration, thereby holding constant the selected RF Output Power over frequency and temperature. Programmable vernier adjustments to power are also vital when the system includes additional components that may lie outside the loop and past the power monitoring point in a system.

DETAILED DESCRIPTION OF THE DRAWINGS

Figure 1:
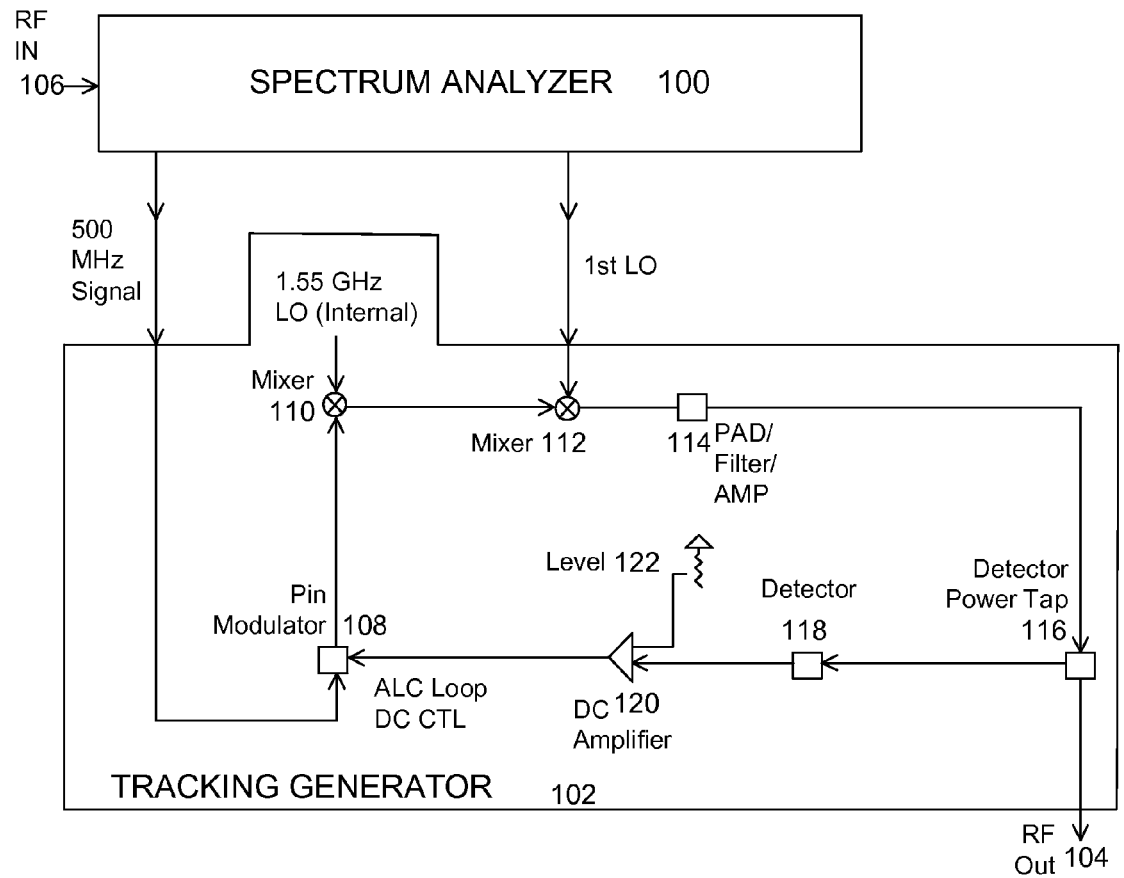
FIG. 1 shows an automatic level control circuit.

FIG. 1 shows an automatic level control (ALC) circuit. The ALC of FIG. 1 is a basic ALC circuit as may be used in a tracking generator. The purpose of the ALC loop is to automatically keep the radio frequency (RF) power level constant at RF Out as the tracking generator sweeps across a range of frequencies. FIG. 1 shows a spectrum analyzer 100 and a tracking generator 102. The tracking generator develops the same frequency at RF Out 104 as the spectrum analyzer is tuned to receive at RF IN 106. The ALC loop in the tracking generator contains a PIN Modulator 108, two mixers 110 and 112, a fixed pad/filter/amp 114, a power monitor (Detector PWR TAP) 116, a detector 118, a DC amplifier 120, and a level adjust 122. The detector 118 provides a feedback DC voltage that correlates to the Power level at RF Out 104. This voltage drives the DC Amplifier 120 which compares that voltage to the reference "LEVEL" voltage produced by level adjust 122 applied to its other input. The DC Amplifier 120 adjusts its output voltage to equalize the voltage at its 2 inputs. The reference voltage "LEVEL" is chosen to set the Power level at RF OUT. The output voltage from the DC Amplifier 120 controls the attenuation of the PIN Modulator 108 thus varying its output signal level. The PIN Modulator 108 also receives a 500 MHz input signal from the spectrum analyzer 100.

The output signal from the PIN Modulator 108 drives mixer 110, which also receives a 1.55 GHz LO input signal, and the resulting mixer output signal power travels around the loop through mixer 112, which also receives a LO input signal, and pad/filter/amp 114. The portion of the adjusted power level is then again detected and continues to cause the ALC loop to respond. The process continues automatically until equilibrium is reached in the loop and the voltages at the two inputs of the DC Amplifier 120 are equal.

The loop shown in FIG. 1 is limited by the power level over which the detector will operate, the noise performance of the DC amplifier, and the level control range of the pin modulator. In addition there is an operating power range over which the mixer in the loop will operate properly without power compression. In the ALC of FIG. 1 there are no means for programming the ALC loop in a way to minimize spurious signals reaching RF Out.

Figure 2:
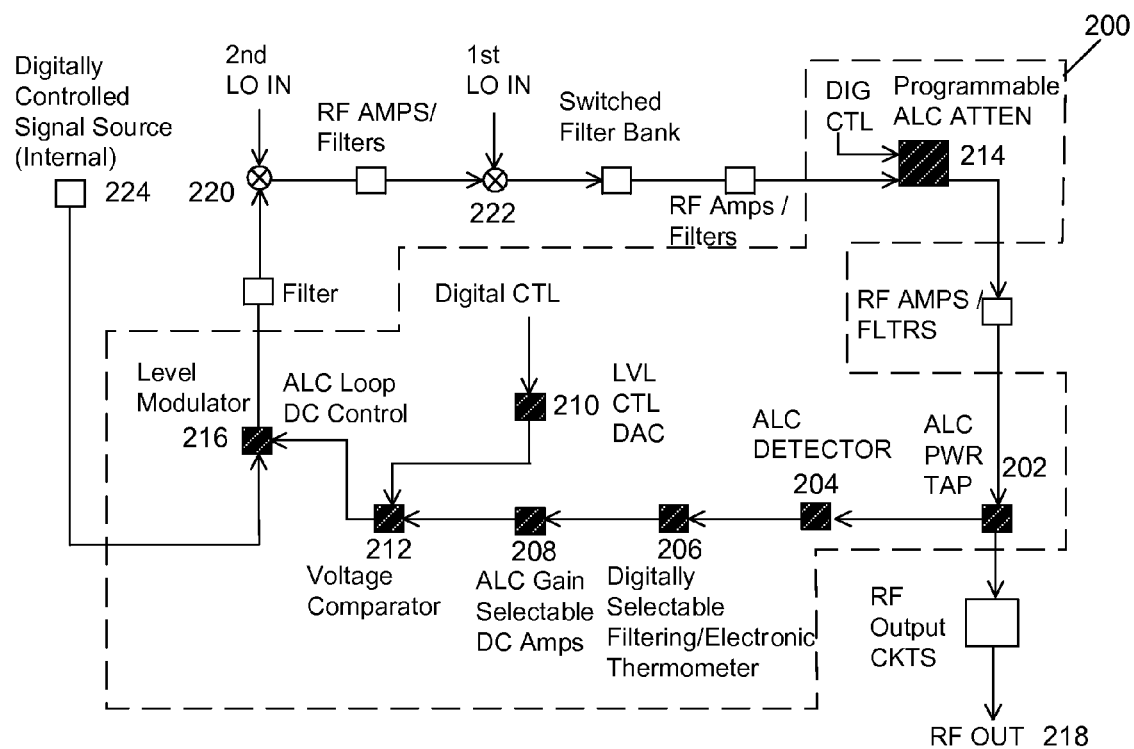
FIG. 2 shows an enhanced programmable automatic level control circuit in accordance with an embodiment.

FIG. 2 shows an enhanced programmable automatic level control circuit in accordance with an embodiment. In FIG. 2, the automatic level control loop has been integrated with newly introduced components as shown within dotted area 200. The resulting loop, also known as the enhanced programmable automatic control loop (EPACL), enhances the performance (i.e. loop stability, bandwidth, speed, spur rejection, etc.) of an existing ALC by means of programmable loop components.

These components can include an ALC power monitor (ALC PWR TAP) 202 which provides a portion of the RF power to a detector. In one embodiment, the detector can be ALC DETECTOR 204 which is a temperature stabilized detector that produces a DC feedback voltage. The DC feedback voltage is proportional to the RF Output Power at RF OUT 218. The ALC detector 204 produces a stable DC output versus temperature. This has the advantage of eliminating RF Output power drift over temperature. In a typical detector, the resistances of various components vary widely as those components warm up during use. This can cause the output of the ALC to also vary widely during use, undermining performance. By using ALC DETECTOR 204, a temperature stabilized detector, the output of the ALC can remain stable over a wide temperature range, improving performance of the ALC.

In one embodiment, the enhanced programmable automatic control loop also includes a digitally selectable filter 206 which is under software/thermometer control. The digitally selectable filter removes RF signals from the output of the detector and increases the range of RF frequencies over which the ALC can operate. In a typical RF detector circuit, circuit components must be chosen such that the detector will function across some specified range of RF input frequency while not compromising the stability of the ALC circuit. Additionally, depending on the application of the ALC, other considerations, such as transient response requirements, may establish a minimum limit for control loop bandwidth.

Filters used in such circuits are typically of fixed value. The components of the filters are chosen as a compromise between operable frequency range, control loop stability, and other performance factors according to the anticipated operating conditions of the ALC. In general, the components of the filter must be chosen such that the minimum RF frequency compatible with an ALC is approximately ten times the control loop bandwidth. However, as temperature varies, the filter characteristics also change. Factoring in performance changes as a result of temperature fluctuations, minimum RF frequency can quickly rise to four thousand times control loop bandwidth. Single value filters require significant performance compromises to meet such standards.

By using a digitally selectable filter, rather than the single-value filter of a typical detector circuit, a software controller can change the characteristics of the filter to compensate for temperature changes. This extends, to lower frequencies, the range of RF frequency that can be leveled without sacrificing control loop stability or responsiveness. This also has the advantage of avoiding ALC related distortion of the leveled signal and is achieved without adversely affecting ALC loop stability. Additionally, this allows for additional performance requirements to be met while maintaining adequate RF suppression.

Additionally, in one embodiment, the enhanced programmable automatic level control loop includes a gain selectable DC amplifier 208. The gain of the DC amplifier 208 is digitally controlled. This provides a unique arrangement of selectable gain values that optimize ALC loop gain. This has the advantage of ensuring fast and stable ALC loop response. The aforementioned arrangement also provides accurate leveling of continuous wave (CW) or digitally modulated signals. Typical ALC loops often do not use an amplifier or use logarithmic amplifiers which add distortion to signals. In an embodiment, by making the gain selectable, a linear amplifier can be used instead of a logarithmic amplifier, thereby producing more accurate level detection of modulated signals.

A voltage comparator, or loop amplifier, 212 receives as input a reference signal generated by the DAC 210 and the output of the gain selectable DC amplifier 208. The reference signal generated by the DAC 210 serves effectively as a programmable vernier power control. The voltage comparator 212 adjusts its output voltage until the voltages at its two inputs are equal. A level modulator 216 (LEVEL MODULATOR) is connected to the output of the voltage comparator 212. The level modulator 216 also receives input from an RF signal source 224. The level modulator varies its attenuation and changes the power level at its output as a function of the control signal applied to it by the comparator (loop amplifier) 212. The output of the level modulator is filtered and then fed into mixer 220 where it is mixed with a second LO input.

In one embodiment, the output of mixer 220 may be passed through additional filters, mixers, and amplifiers, such as mixer 222 where it is mixed with a first LO input, depending on application. After the signal is mixed, it is passed to a programmable ALC attenuator 214. Typically, attenuators are used outside of the automatic control loop to adjust the output. By placing an attenuator, such as programmable ALC attenuator 214, in the control loop, the system software can control the ALC attenuator to optimize RF path gain versus frequency. The ALC Attenuator is used to maximize the RF-to-LO power ratio in the mixers thus minimizing the level of spurious signals at the RF output 218. RF from the ALC Attenuator is amplified, then passed through tap point 202 where it is monitored by level detector 204. Level detector 204 produces a DC voltage that is proportional to RF power at RF Out 218. That DC voltage is amplified by selectable gain amplifier 208 and fed back to comparator (loop amp) 212, thereby completing the level control loop. The closed loop acts to achieve voltage equilibrium across the inputs of comparator (loop amplifier) 212, thereby establishing indirect control of the RF level at RF Out 218 by means of Level DAC 210.

In one embodiment, an enhanced programmable automatic level control loop (EPACL) comprises an input for receiving an input RF signal and a level modulator, wherein the level modulator receives the input RF signal and a control signal and wherein the level modulator produces a first signal. The EPACL also comprises a mixer that receives the first signal and mixes it with a LO signal to produce a second signal and a programmable attenuator that receives the second signal and produces an output signal. The EPACL further comprises a level detector that monitors RF power of the output signal and produces a DC voltage proportional the RF power, wherein the DC voltage and a reference voltage are received at a loop amplifier which produces the control signal such that the reference voltage and the DC voltage become equal.

In accordance with an embodiment, the level detector can be a temperature compensated level detector that produces a stable DC voltage across a range of operating temperatures. In another embodiment the EPACL can also comprise a selectable filter that receives the DC voltage from the level detector and produces a filtered DC voltage, wherein filter characteristics of the selectable filter are software controllable, wherein the filtered DC voltage is fed to the loop amplifier. The EPACL may also comprise a gain selectable amplifier that receives the filtered DC voltage from the selectable filter and produces an amplified voltage that is fed to the loop amplifier.

In one embodiment, the EPACL can also comprise a second mixer that receives the second signal and mixes it with a second LO signal to produce a third signal, wherein the third signal is received by the programmable attenuator to produce the output signal. In one embodiment the EPACL can further comprise a power monitor that receives the output signal and provides a portion of the output signal to the level detector.

In another embodiment, an EPALC, as described above, can be implemented in a tracking generator. In such an embodiment, the EPALC automatically controls the output of the tracking generator such that the output level remains constant as the tracking generator sweeps across a frequency range. A network may be connected at an output node of the EPALC (RF OUT) and an output node on the network can be connected to a spectrum analyzer. The tracking generator and spectrum analyzer can then be used to measure the frequency response of the network.

Although the present invention has been described above with particularity, this was merely to teach one of ordinary skill in the art how to make and use the invention. Many modifications will fall within the scope of the invention, as that scope is defined by the following claims.

What is claimed:

1. An enhanced programmable automatic level control loop comprising:
   an input for receiving an input RF signal;
   a level modulator, wherein the level modulator receives the input RF signal and a control signal and wherein the level modulator produces a first signal;
   a mixer that receives the first signal and mixes it with a LO signal to produce a second signal;
   a programmable attenuator that receives the second signal and produces an output signal;
   a level detector that monitors RF power of the output signal and produces a DC voltage proportional the RF power;
   a selectable filter that receives the DC voltage from the level detector and produces a filtered DC voltage, wherein filter characteristics of the selectable filter are software controllable and wherein the filtered DC voltage is fed to a gain selectable amplifier;
   the gain selectable amplifier that receives the filtered DC voltage from the selectable filter and produces an amplified voltage that is fed to a loop amplifier; and
   wherein the amplified voltage and a reference voltage are summed at the loop amplifier which produces the control signal such that the reference voltage and the amplified voltage cancel at a summation point.

2. The enhanced programmable automatic level control loop of claim 1 wherein the level detector is a temperature compensated level detector that produces a stable DC voltage across a range of operating temperatures.

3. The enhanced programmable automatic level control loop of claim 1 wherein the gain selectable amplifier is a linear amplifier.

4. The enhanced programmable automatic level control loop of claim 1 wherein the reference voltage is produced by a digital to analog converter (DAC).

5. The enhanced programmable automatic level control loop of claim 1 further comprising:
   a second mixer that receives the second signal and mixes it with a second LO signal to produce a third signal, wherein the third signal is received by the programmable attenuator to produce the output signal.

6. The enhanced programmable automatic level control loop of claim 1 further comprising:
   a power monitor that receives the output signal and provides a portion of the output signal to the level detector.

7. An enhanced programmable automatic level control loop comprising:
   an input for receiving an input RF signal;
   a level modulator, wherein the level modulator receives the input RF signal and a control signal and wherein the level modulator produces a first signal;
   a mixer that receives the first signal and mixes it with a LO signal to produce a second signal;
   a programmable attenuator that receives the second signal and produces an output signal;
   a power monitor that receives the output signal and divides the output signal into two portions;
   a temperature compensated level detector that produces a stable DC voltage across a range of operating temperatures, monitors RF power of a portion of the output signal received from the power monitor, and produces a DC voltage proportional the portion of the RF power;
   a selectable filter that receives the DC voltage from the level detector and produces a filtered DC voltage, wherein filter characteristics of the selectable filter are software controllable;
   a gain selectable amplifier that receives the filtered DC voltage from the selectable filter and produces an amplified voltage that is fed to the loop amplifier;
   a reference voltage produced by a digital to analog converter (DAC); and
   wherein the amplified voltage and the reference voltage are received at a loop amplifier which produces the control signal.

8. The enhanced programmable automatic level control loop of claim 7 wherein the programmable attenuator maintains a constant output power.

9. The enhanced programmable automatic level control loop of claim 7 wherein filter characteristics of the selectable filter controlled according to temperature.

10. The enhanced programmable automatic level control loop of claim 7 wherein a gain value of the gain selectable amplifier is controlled based on conditions of the enhanced automatic level control loop.

11. The enhanced programmable automatic level control loop of claim 7 wherein the gain selectable amplifier is a linear amplifier.

12. The enhanced programmable automatic level control loop of claim 7 further comprising:
    a second mixer that receives the second signal and mixes it with a second LO signal to produce a third signal, wherein the third signal is received by the programmable attenuator to produce the output signal.

13. A tracking generator including an enhanced programmable automatic level control loop comprising:
    an input for receiving an input RF signal;
    a level modulator, wherein the level modulator receives the input RF signal and a control signal and wherein the level modulator produces a first signal;
    a mixer that receives the first signal and mixes it with a LO signal to produce a second signal;
    a programmable attenuator that receives the second signal and produces an output signal;
    a power monitor that receives the output signal and divides the output signal into two portions;
    a temperature compensated level detector that produces a stable DC voltage across a range of operating temperatures, monitors RF power of a portion of the output signal received from the power monitor, and produces a DC voltage proportional the portion of the RF power;
    a selectable filter that receives the DC voltage from the level detector and produces a filtered DC voltage, wherein filter characteristics of the selectable filter are software controllable;
    a gain selectable amplifier that receives the filtered DC voltage from the selectable filter and produces an amplified voltage that is fed to the loop amplifier;
    a reference voltage produced by a digital to analog converter (DAC); and
    wherein the amplified voltage and the reference voltage are received at a loop amplifier which produces the control signal.

14. The tracking generator including an enhanced programmable automatic level control loop of claim 13 wherein the programmable attenuator maintains a constant output power.

15. The tracking generator including an enhanced programmable automatic level control loop of claim 13 wherein filter characteristics of the selectable filter controlled according to temperature.

16. The tracking generator including an enhanced programmable automatic level control loop of claim 13 wherein a gain value of the gain selectable amplifier is controlled based on conditions of the enhanced automatic level control loop.

17. The tracking generator including an enhanced programmable automatic level control loop of claim 13 wherein the gain selectable amplifier is a linear amplifier.

18. The tracking generator including an enhanced programmable automatic level control loop of claim 13 further comprising:
 a second mixer that receives the second signal and mixes it with a second LO signal to produce a third signal, wherein the third signal is received by the programmable attenuator to produce the output signal.

* * * * *